United States Patent [19]

Tsuru et al.

[11] Patent Number: 5,767,817
[45] Date of Patent: Jun. 16, 1998

[54] ANTENNA APPARATUS HAVING CHIP ANTENNA AND CAPACITANCE GENERATING DEVICE

[75] Inventors: Teruhisa Tsuru, Kameoka; Harufumi Mandai, Takatsuki; Seiji Kanba, Otsu; Kenji Asakura, Shiga-ken, all of Japan

[73] Assignee: Murata Manufacturing Co. Ltd., Kyoto, Japan

[21] Appl. No.: 701,594

[22] Filed: Aug. 22, 1996

[30] Foreign Application Priority Data

Aug. 23, 1995 [JP] Japan .................... 7-214899

[51] Int. Cl.⁶ .................... H01Q 1/24; H01Q 1/36
[52] U.S. Cl. .................... 343/895; 343/702; 343/873
[58] Field of Search .................... 343/895, 702, 343/700 MS, 846, 847, 848, 850, 873; H01Q 1/24, 1/36

[56] References Cited

U.S. PATENT DOCUMENTS 5,627,551  5/1997  Tsuru et al. .................... 343/702

FOREIGN PATENT DOCUMENTS 0621653  10/1994  European Pat. Off. .
0707354   4/1996  European Pat. Off. .
0743699  11/1996  European Pat. Off. .

*Primary Examiner*—Hoanganh T. Le
*Attorney, Agent, or Firm*—Ostrolenk, Faber, Gerb & Soffen, LLP

[57] ABSTRACT

An antenna apparatus having a predetermined impedance is provided. The apparatus has a chip antenna including a conductor and a mounting board on which the antenna is mounted. A ground pattern and a microstrip line are formed on the board. A feeding terminal for applying a voltage to the conductor is deposited on the surface of the antenna. Solder may be used to connect the feeding terminal of the antenna to the microstrip line formed on the board. A capacitance generating device, e.g., a dielectric resin or capacitor is disposed between the microstrip line connected to the feeding terminal of the antenna and the ground pattern. A capacitance is thus generated between the microstrip line and the ground pattern thereby enabling regulation of the antenna apparatus impedance and bandwidth.

12 Claims, 8 Drawing Sheets

ANTENNA APPARATUS HAVING CHIP ANTENNA AND CAPACITANCE GENERATING DEVICE

BACKGROUND OF THE INVENTION

1. Field of the Invention

The present invention relates to an antenna apparatus for use in mobile communications and local area networks (LAN).

2. Description of the Related Art

Referring to a perspective view of FIG. 11, a conventional antenna apparatus generally designated by 50 includes a chip antenna 51, a mounting board 52 on which the chip antenna 51 is mounted, a ground pattern 53 formed on the board 52, and a microstrip line 54 also formed on the board 52. This chip antenna 51 is formed, as shown in the longitudinal cross-sectional view of FIG. 12, of an insulator 55, a coil-like conductor 56, a magnetic substance 57, and external connecting terminals 58a and 58b.

However, the antenna apparatus of the above conventional type encounters the following problem. Namely, when the chip antenna is mounted on the board, the resonant frequency and the impedance of the chip antenna disadvantageously deviate from the determined values depending on the material of the board, the configuration of the ground pattern, the material of a casing for accommodating the apparatus therein, and other conditions. The resonant frequency of the chip antenna is adjustable in advance allowing for deviations, while the impedance is unadjustable.

SUMMARY OF THE INVENTION

Accordingly, it is an object of the present invention to provide an antenna apparatus that can ensure a predetermined impedance, free from the above-described problem.

In order to achieve the above object, according to the present invention, there is provided an antenna apparatus comprising: a chip antenna having a substrate, at least one conductor formed on at least one of a surface portion and an inside portion of the substrate, and at least one feeding terminal disposed on the surface of the substrate so as to apply a voltage to the conductor; a mounting board including a ground pattern, for mounting the chip antenna on the board; and a capacitance-generating device disposed between the feeding terminal of the chip antenna and the ground pattern of the mounting board.

The capacitance-generating device may comprise a dielectric resin, a capacitor or an open stub.

With this arrangement, according to the antenna apparatus of the present invention, the provision of the capacitance-generating device makes it possible to adjust the impedance of the apparatus.

Other features and advantages of the present invention will become apparent from the following description of the invention which refers to the accompanying drawings.

DETAILED DESCRIPTION OF EMBODIMENTS OF THE INVENTION

Figure 1:
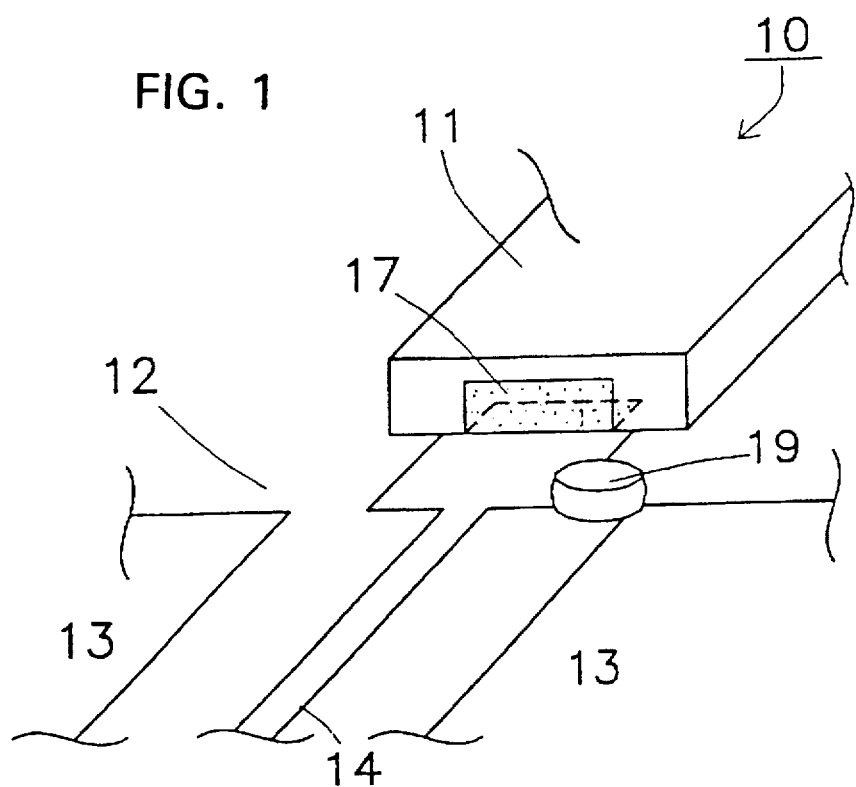
FIG. 1 is a perspective view of an antenna apparatus according to a first embodiment of the present invention.

Referring to the perspective view shown in FIG. 1, an antenna apparatus generally designated by 10 includes a chip antenna 11, a mounting board 12 on which the chip antenna 11 is mounted, a ground pattern 13, and a microstrip line 14, both the pattern 13 and the line 14 being formed on the board 12.

Figure 2:
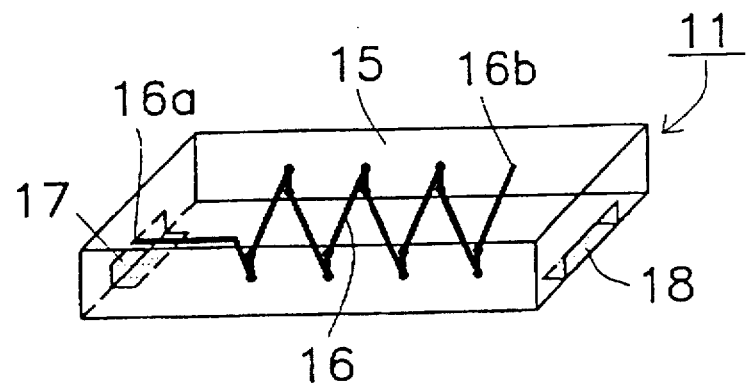
FIG. 2 is a perspective phantom view of the chip antenna of the apparatus shown in FIG. 1.

The chip antenna 11 is packaged within a rectangular prism-shaped dielectric substrate 15 essentially consisting of titanium oxide and barium oxide and comprises, as illustrated in FIG. 2, a conductor 16 that is spirally wound in or along the substrate 15 in its longitudinal direction, a feeding terminal 17 for applying a voltage to the surface of the substrate 15, and a mounting terminal 18 for securing the chip antenna 11 on the board 12. One end of the conductor 16 serves as a feeding end 16a connected to the feeding terminal 17, while the other end is free to form a free end 16b within the dielectric substrate 15. The feeding terminal 17 of the chip antenna 11 is connected to the microstrip line 14 formed on the board 12 by means of soldering (not shown), thereby forming the antenna apparatus 10. Further, a capacitance-generating device, i.e., a dielectric resin 19, is disposed between the microstrip line 14 connected to the terminal 17 of the antenna 11 and the ground pattern 13 so as to generate a capacitance between the microstrip line 14 and the ground pattern 13.

Figure 3:
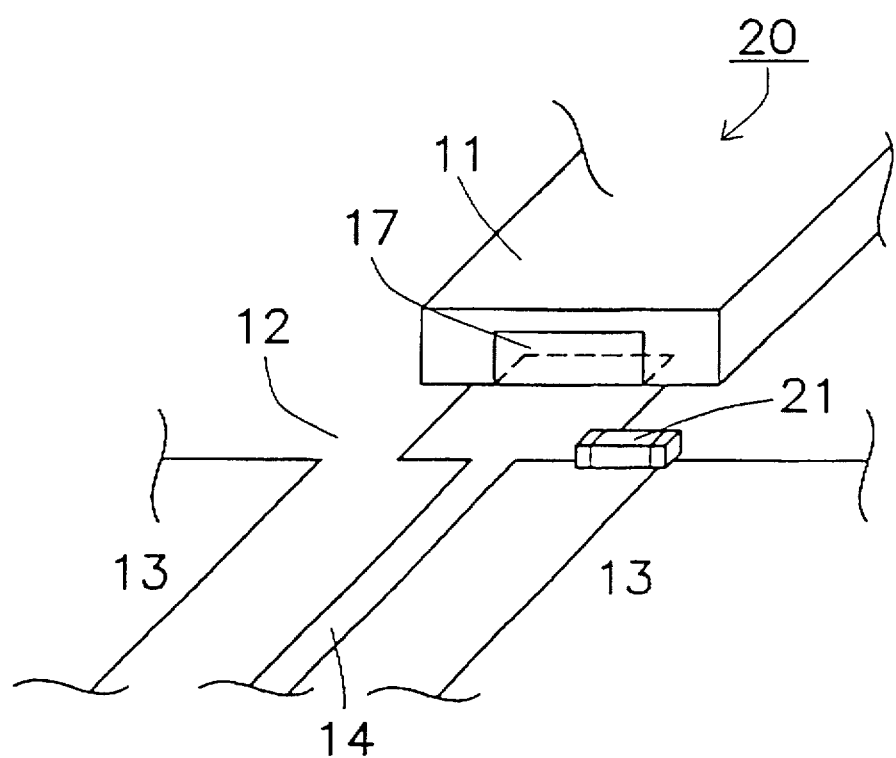
FIG. 3 is a perspective view of an antenna apparatus according to a second embodiment of the present invention.

Referring to the perspective view illustrated in FIG. 3, there is shown an antenna apparatus of a second embodiment of the present invention. The antenna apparatus generally designated by 20 differs from the antenna apparatus 10 of the first embodiment in that a capacitor 21 is used as the capacitance-generating device disposed between the microstrip line 14 connected to the feeding terminal 17 of the chip antenna 11 and the ground pattern 13. This capacitor 21 generates a capacitance between the microstrip line 14 and the ground pattern 13.

Figure 4:
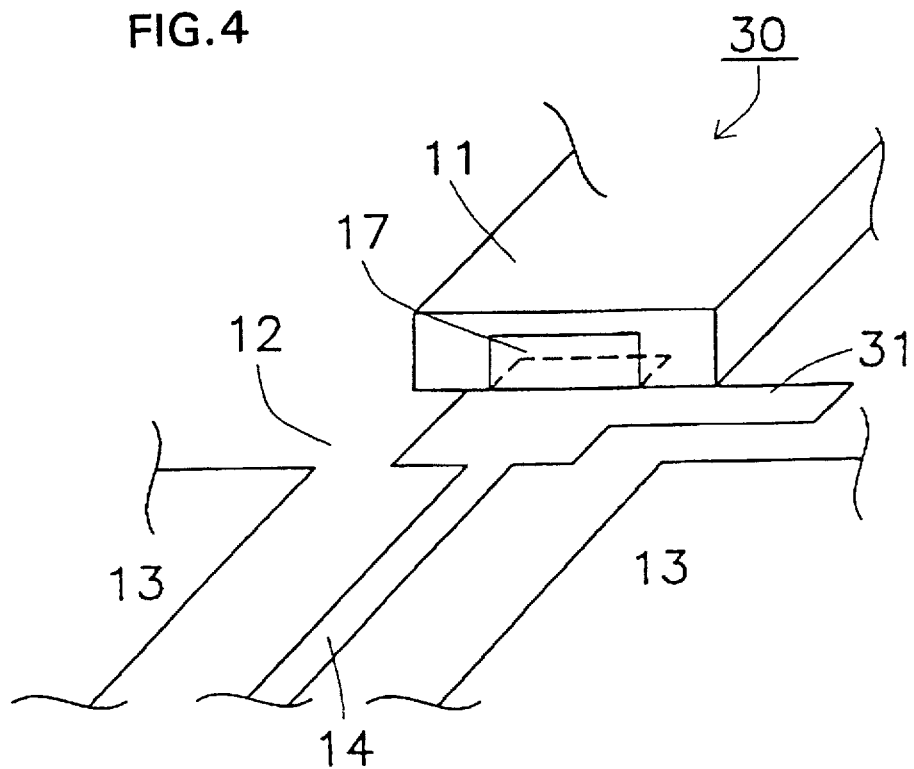
FIG. 4 is a perspective view of an antenna apparatus according to a third embodiment of the present invention.

FIG. 4 is a perspective view of an antenna apparatus according to a third embodiment of the present invention. The antenna apparatus generally indicated by 30 differs from the antenna apparatus 10 of the first embodiment in that an open stub 31 serves as the capacitance-generating device formed between a portion extending from the microstrip line 14 connected to the feeding terminal 17 of the chip antenna 11 and a grounding electrode (not shown) on the reverse surface of the ground pattern 13. This open stub 31 produces a capacitance between the microstrip line 14 and the ground pattern 13.

Figure 5:
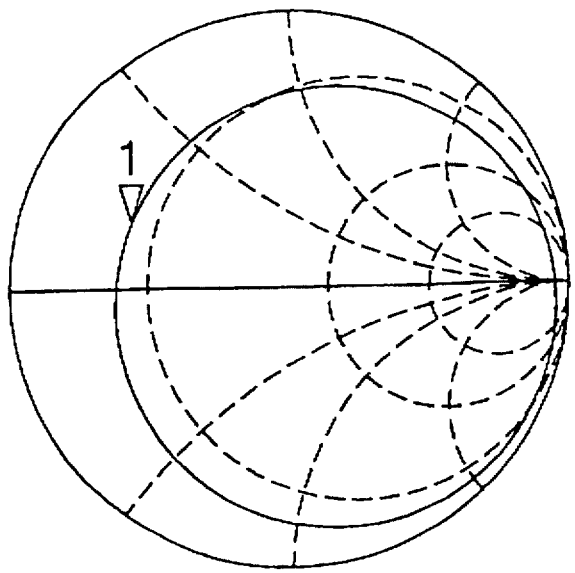
FIG. 5 illustrates impedance characteristics of an antenna apparatus without having a capacitance-generating device.
Figure 6:
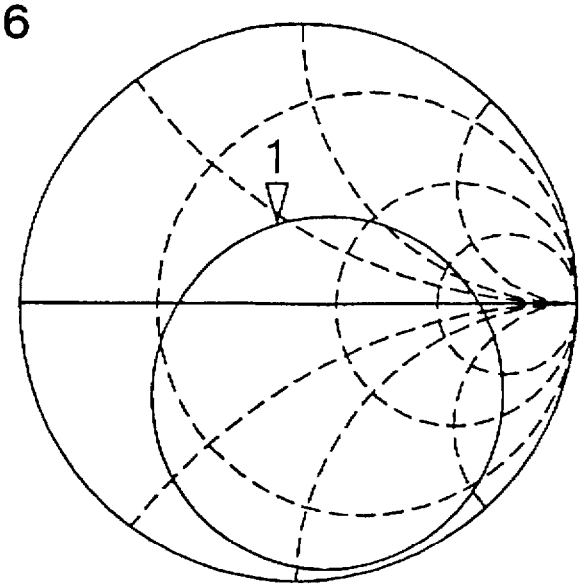
FIG. 6 illustrates impedance characteristics of an antenna apparatus provided with a capacitor-generating device having a capacitance of 1 pF.
Figure 7:
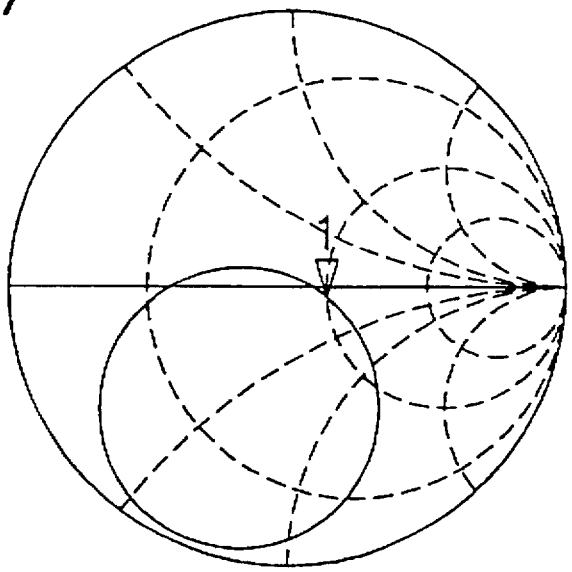
FIG. 7 illustrates impedance characteristics of an antenna apparatus provided with a capacitor-generating device having a capacitance of 2 pF.
Figure 8:
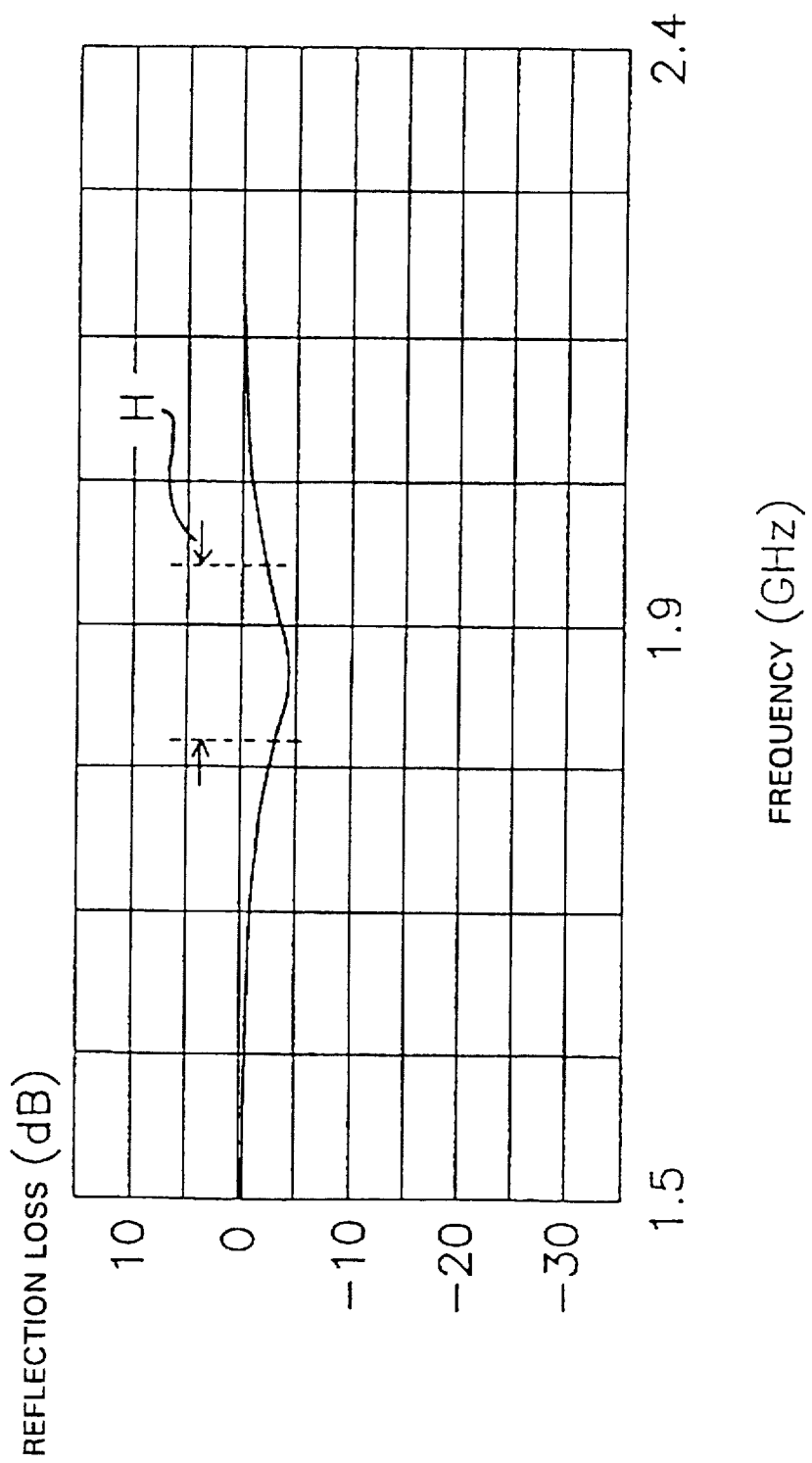
FIG. 8 illustrates reflection-loss characteristics of an antenna without having a capacitance-generating device.
Figure 9:
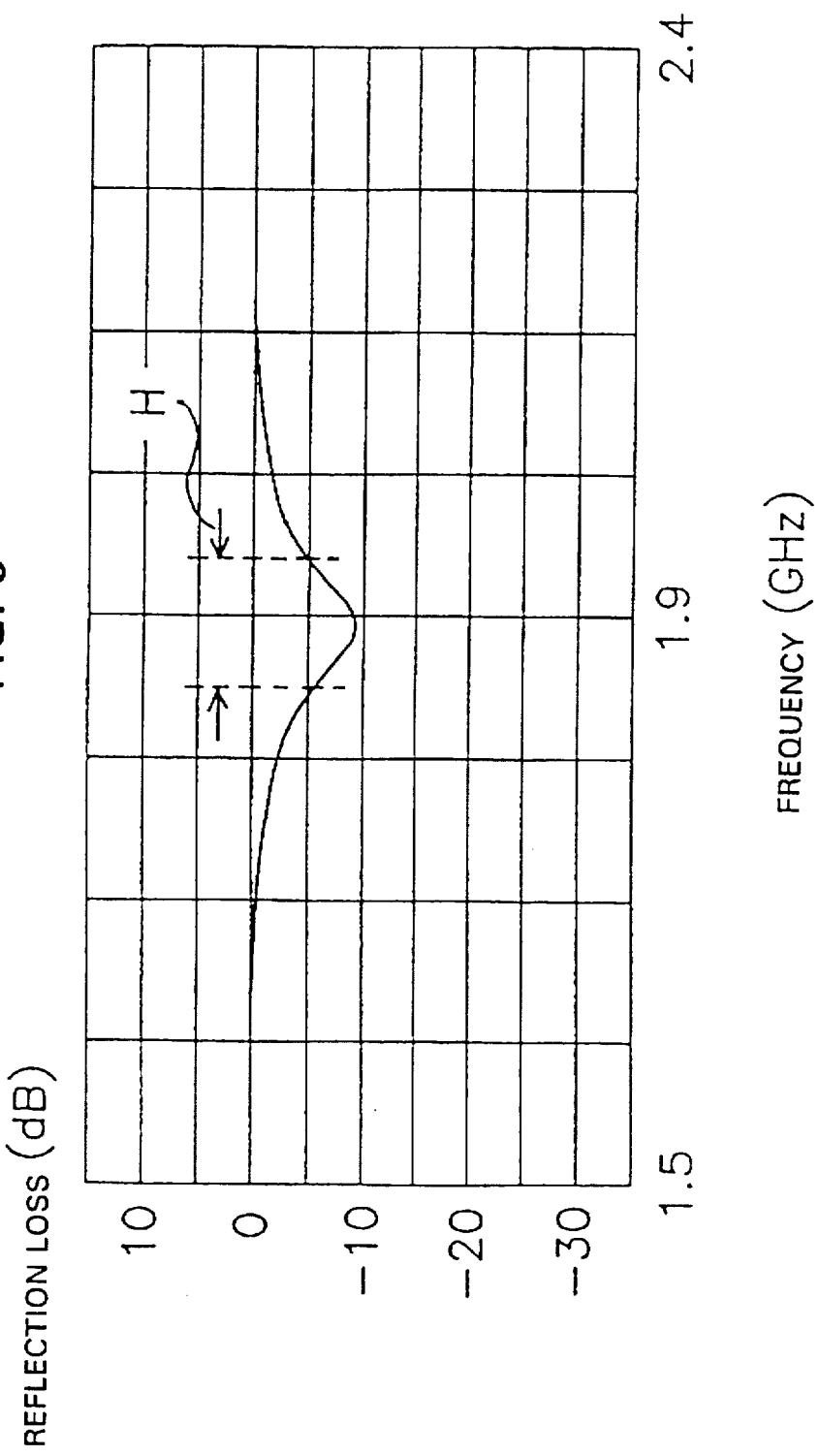
FIG. 9 illustrates reflection-loss characteristics of an antenna apparatus provided with a capacitor-generating device having a capacitance of 1 pF.
Figure 10:
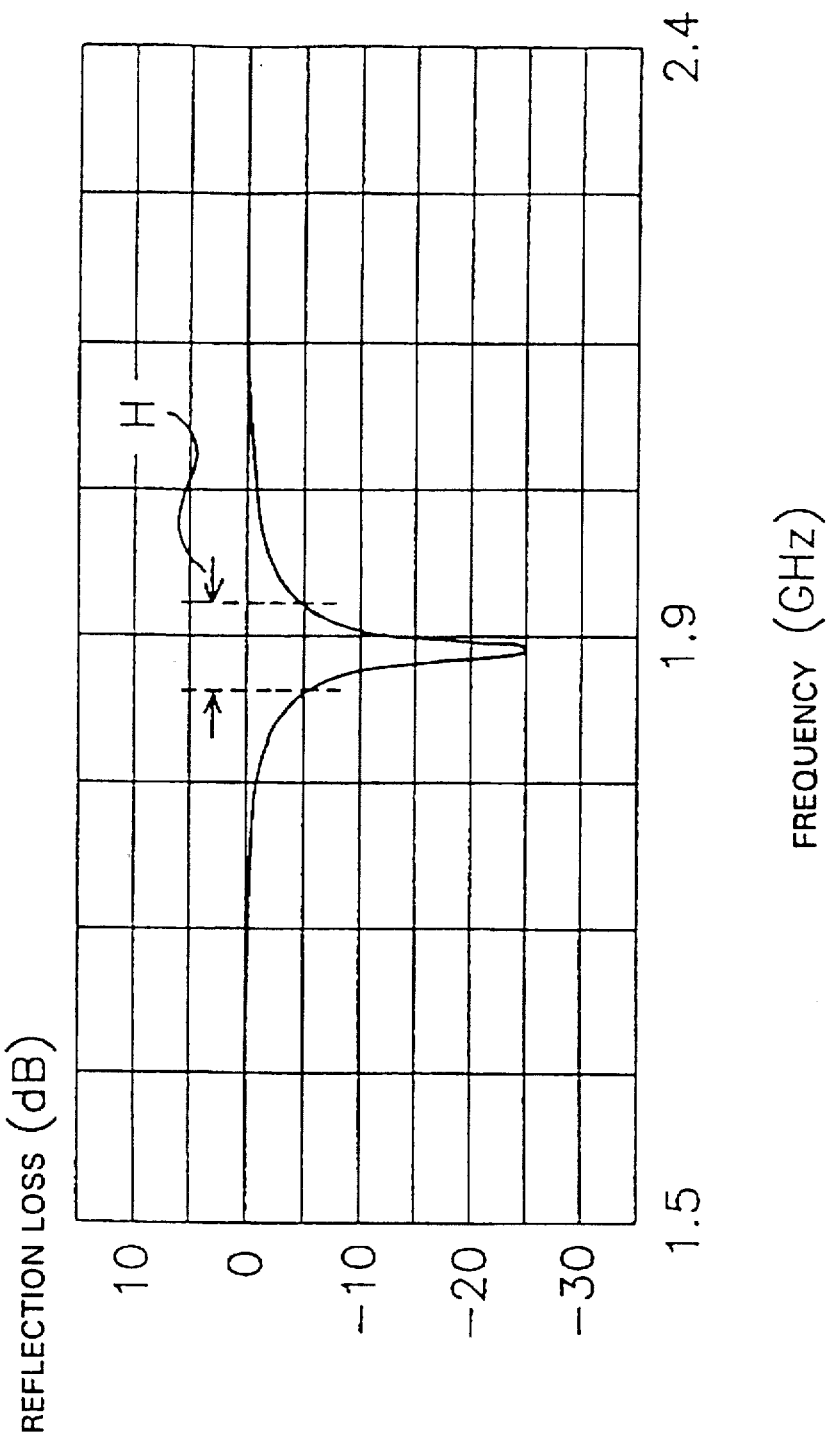
FIG. 10 illustrates reflection-loss characteristics of an antenna apparatus provided with a capacitor-generating device having a capacitance of 2 pF.
Figure 11:
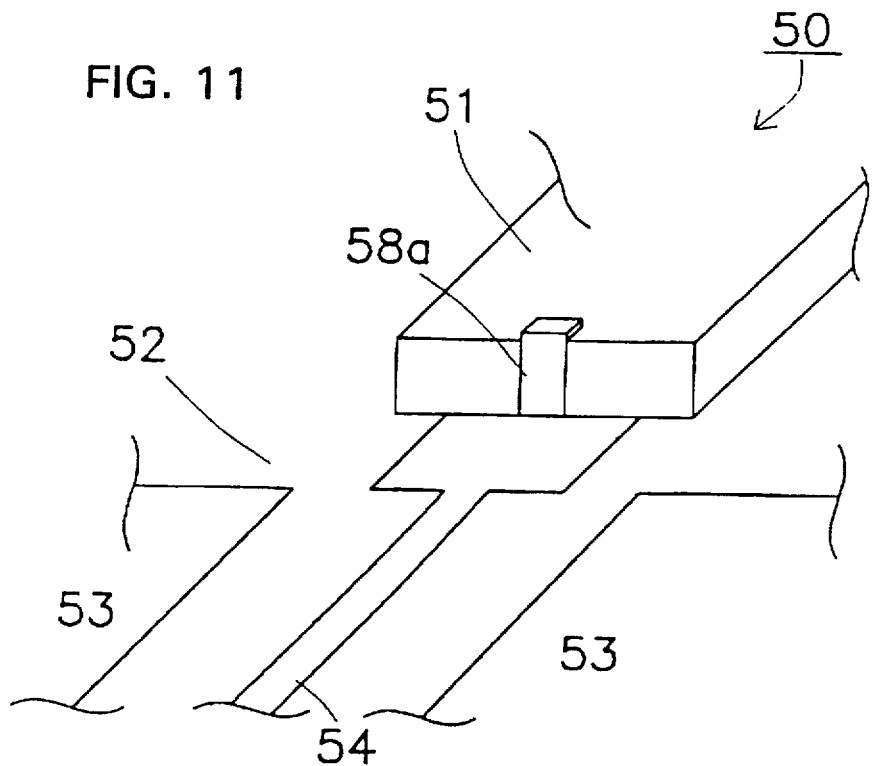
FIG. 11 is a perspective view of a conventional antenna apparatus.
Figure 12:
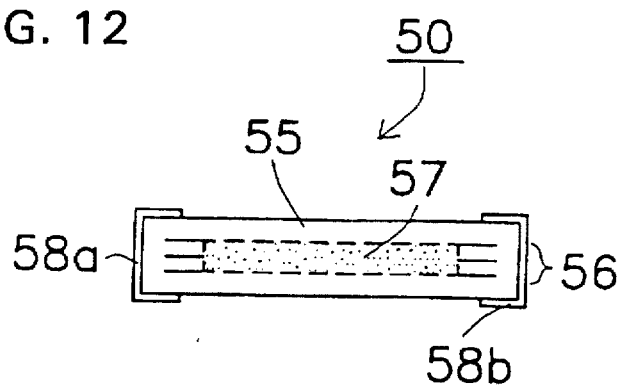
FIG. 12 is a sectional view of the chip antenna of the apparatus shown in FIG. 11.

Impedance characteristics of the antenna apparatus are shown in FIGS. 5, 6 and 7, while insertion-loss characteristics of the apparatus are illustrated in FIGS. 8, 9 and 10. FIGS. 5 and 8 illustrate impedance characteristics and insertion-loss characteristics resulting from the apparatus without disposing capacitance-generating device; FIGS. 6 and 9 illustrate the above-described characteristics obtained from the apparatus provided with a capacitance-generating device having a capacitance of 1 pF; and FIGS. 7 and 10 show the above-described characteristics obtained from the apparatus provided with a capacitance-generating device having a capacitance of 2 pF.

Table 1 shows the impedances at the center frequency (1.9 GHz: indicated by the arrow 1 in FIGS. 5 through 7) resulting from the characteristics shown in FIGS. 5 through 7 and also indicates the bandwidths resulting from the characteristics shown in FIGS. 8 through 10.

TABLE 1

|  | Impedance at the center frequency ($\Omega$) | Bandwidth of the antenna apparatuses (MHz) |
| --- | --- | --- |
| No capacitance-generating device | 12.99 | 123.5 |
| Capacitance-generating device of 1 pF | 32.72 | 91.6 |
| Capacitance-generating device of 2 pF | 49.59 | 57.3 |

As is clearly seen from Table 1, it has been validated that if a dielectric resin is disposed as the capacitance-generating device, the impedance at the center frequency can be adjusted, and accordingly, the bandwidth can also be regulated.

Alternatively, if a capacitor is used as the capacitance-generating device, only a small area is required for mounting the capacitor on the board, which makes it possible to select a desired capacitance. The costs of the apparatus can also be reduced. On the other hand, if an open stub is employed as the capacitance-generating device, the capacitance of the open stub is adjustable by varying the area of the extending portion from the microstrip line, thereby obtaining a desired impedance.

In this manner, according to the above-described embodiments, the provision of the capacitance-generating device makes it possible to obtain a desired impedance at the center frequency, whereby a desired bandwidth can also be acquired.

The foregoing embodiments have been explained in which the substrate of the chip antenna is formed of a dielectric material comprising mainly titanium oxide and barium oxide. However, this is not exclusive, and the substrate of the chip antenna may be formed of a dielectric material comprising mainly aluminum oxide or silica, a magnetic material essentially comprising nickel, cobalt and iron, or a combination of a dielectric material and a magnetic material.

Moreover, although in the above-described embodiments a spiral conductor is formed within the substrate of the chip antenna, it may be formed on at least one of the surface portion and the inside portion of the substrate. Alternatively, a meander-like conductor may be formed on at least one of the surface portion and the inside portion of the substrate. Additionally, the position of the feeding terminal defined in the above-described embodiments is not essential to carry out the present invention.

As is clearly understood from the foregoing description, the present invention offers the following advantages. The capacitance-generating device is disposed between the feeding terminal of the chip antenna and the microstrip line formed on the mounting board so as to obtain a desired impedance at the center frequency, thereby acquiring a desired bandwidth.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. An antenna apparatus comprising:
   a chip antenna having a substrate, at least one conductor formed on at least one of a surface portion and an inside portion of said substrate, and at least one feeding terminal disposed on the surface of said substrate so as to apply a voltage to said conductor;
   a mounting board including a ground pattern, for mounting said chip antenna on said board; and
   a capacitance-generating device disposed between the feeding terminal of said chip antenna and the ground pattern of said mounting board on said mounting board.

2. An antenna apparatus according to claim 1, wherein said capacitance-generating device comprises a capacitor.

3. An antenna apparatus according to claim 1, wherein said capacitance-generating device comprises an open stub forming a capacitance with a ground plane.

4. An antenna apparatus according to claim 3, wherein the ground plane is disposed on a side of the mounting board opposite the side on which the open stub is disposed.

5. An antenna apparatus according to claim 1, wherein the capacitance-generating device comprises a dielectric resin.

6. An antenna apparatus according to claim 1, wherein the capacitance generating device is used to adjust an impedance of the antenna apparatus.

7. An antenna apparatus according to claim 1, wherein the capacitance generating device is used to adjust a desired bandwidth of the antenna apparatus.

8. An antenna apparatus according to claim 1, wherein the conductor is spiral shaped.

9. An antenna apparatus according to claim 1, wherein the conductor is a meander-like conductor.

10. An antenna apparatus according to claim 1 wherein the substrate comprises one of a dielectric material, a magnetic material and a combination of a dielectric material and a magnetic material.

11. An antenna apparatus comprising:
    a dielectric substrate having at least one flat surface to be mounted on a mounting board;
    a conductor disposed spirally in the dielectric substrate;
    a power supply terminal provided on a portion of the surface of said dielectric substrate for applying voltage to the conductor, the conductor having one end coupled to the power supply terminal and a second end left unconnected;
    said mounting board including a ground pattern for mounting said dielectric substrate thereon; and
    a capacitance-generating device disposed between the power supply terminal and the ground pattern of said mounting board.

12. The antenna apparatus of claim 11, wherein the conductor is spirally wound in the substrate in a longitudinal direction of the substrate.

* * * * *